US012216226B2

(12) United States Patent
Moehlmann et al.

(10) Patent No.: US 12,216,226 B2
(45) Date of Patent: Feb. 4, 2025

(54) RADAR SYSTEM

(71) Applicant: NXP B.V., Eindhoven (NL)

(72) Inventors: Ulrich Moehlmann, Moisburg (DE); Cristian Pavao Moreira, Frouzins (FR); Andreas Johannes Köllmann, Rosengarten (DE)

(73) Assignee: NXP B.V., Eindhoven (NL)

( * ) Notice: Subject to any disclaimer, the term of this patent is extended or adjusted under 35 U.S.C. 154(b) by 393 days.

(21) Appl. No.: 17/661,944

(22) Filed: May 4, 2022

(65) Prior Publication Data

US 2022/0365173 A1    Nov. 17, 2022

(30) Foreign Application Priority Data

May 12, 2021   (EP) ..................................... 21305628

(51) Int. Cl.
| | |
|---|---|
| G01S 7/40 | (2006.01) |
| G01S 13/02 | (2006.01) |
| H03L 7/093 | (2006.01) |
| H03L 7/099 | (2006.01) |
| H03K 19/20 | (2006.01) |

(52) U.S. Cl.
CPC ............. G01S 7/40 (2013.01); G01S 7/4017 (2013.01); H03L 7/093 (2013.01); H03L 7/099 (2013.01); G01S 2013/0254 (2013.01); H03K 19/20 (2013.01)

(58) Field of Classification Search
None
See application file for complete search history.

(56) References Cited

U.S. PATENT DOCUMENTS

| | | |
|---|---|---|
| 5,477,181 A | 12/1995 | Li et al. |
| 5,914,996 A | 6/1999 | Huang |
| (Continued) | | |

FOREIGN PATENT DOCUMENTS

| | | |
|---|---|---|
| EP | 1758252 B1 | 4/2010 |
| EP | 3611540 A1 | 2/2020 |

OTHER PUBLICATIONS

Arora, M., "Clock Dividers Made Easy", Design Forward Reuse (CR&D), ST Microelectronics, Sep. 7, 2002.

*Primary Examiner* — Vladimir Magloire
*Assistant Examiner* — Brandon James Henson (57) ABSTRACT

Radar System The disclosure relates to a radar system having multiple radar transceiver modules, in which each module has a clock signal that is synchronised with a clock signal generated by a leader transceiver module. Example embodiments include a radar system (400) comprising a plurality of radar transceiver modules (401, 402) mounted to a common PCB (404), the plurality of radar transceiver modules comprising a leader module (401) and one or more follower modules (402), the leader module (401) comprising a first oscillator (403) configured to provide a first clock signal at a first frequency to each follower module (402), each of the leader and follower modules comprising a phase locked loop, PLL, clock signal generator (300), the PLL clock signal generator (300) comprising a divide by n clock divider (304) arranged to output 2n phase shifted clock signals (314) at a third frequency and a multiplexer (306) connected to receive the 2n phase shifted clock signals from the divide by n clock divider (304) and output a third clock signal (308) selected by an input phase select signal (307).

20 Claims, 7 Drawing Sheets

(56) References Cited

U.S. PATENT DOCUMENTS

| | | |
|---|---|---|
| 6,356,122 B2 | 3/2002 | Sevalia et al. |
| 6,445,228 B1 | 9/2002 | Nguyen |
| 6,696,870 B2 | 2/2004 | Dellow |
| 7,107,477 B1 | 9/2006 | Singh et al. |
| 10,496,127 B1 | 12/2019 | Womac et al. |
| 10,509,104 B1 | 12/2019 | Dato |
| 10,594,327 B2 | 3/2020 | Vaucher et al. |
| 2010/0301906 A1* | 12/2010 | De Laurentiis ........ H03K 23/00 327/156 |
| 2012/0074994 A1 | 3/2012 | Zhong |
| 2019/0068205 A1 | 2/2019 | Tamura et al. |
| 2019/0131979 A1 | 5/2019 | Nilsson |
| 2019/0220055 A1* | 7/2019 | Gal ........................ H03L 7/104 |
| 2019/0273502 A1* | 9/2019 | Khalid .................... G01S 7/032 |
| 2021/0075432 A1* | 3/2021 | Olariu .................. H03L 7/0996 |

\* cited by examiner

RADAR SYSTEM

CROSS-REFERENCE TO RELATED APPLICATIONS

This application claims the priority under 35 U.S.C. § 119 of European Patent application no. 21305628.6, filed on 12 May 2021, the contents of which are incorporated by reference herein.

FIELD

The disclosure relates to a radar system having multiple radar transceiver modules, in which each module has a clock signal that is synchronised with a clock signal generated by a leader transceiver module.

BACKGROUND

Figure 1:
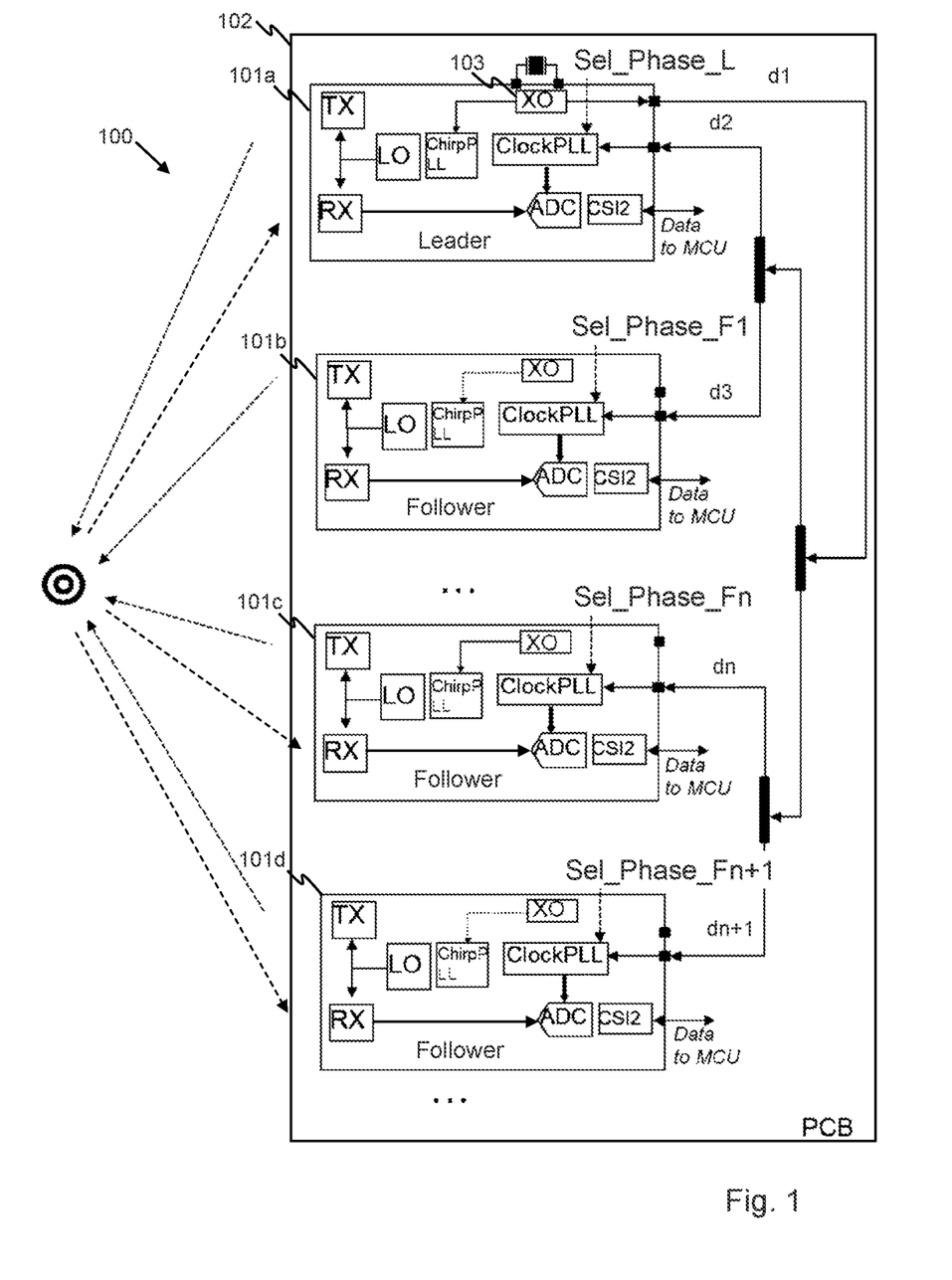
FIG. 1 is a schematic diagram of an example radar system comprising multiple radar transceiver modules.

FIG. 1 illustrates a radar system 100 comprising multiple radar transceiver modules 101a-d, in this case four modules, all mounted on a common printed circuit board (PCB) 102. A first module 101a is designated a leader module and the other modules 101b-d are designated follower modules. The follower modules 101b-d each obtain a reference clock signal derived from an oscillator 103 on the leader module 101a, the reference clock signal being used to generate an analog-to-digital converter (ADC) sampling clock in each module. Due to imperfections on the board 102 or a mismatch between different paths d1-dn connecting the modules, some phase skew may arise between the reference clock signals received at each module. This results in a clock skew of the sampling clock generated by a phase-locked loop (PLL) clock signal generator on each module and leads to limitations in the spatial and velocity resolution of the complete radar system 100.

If the reference clocks received at each module 101a-d could be properly aligned this issue would be improved. This could be done for example by means of a perfectly designed PCB. The production of such a PCB and the phase adjustment, either automatically or by hand, to remove all production spread among the modules can be very expensive and indeed may not be possible at all.

An alternative solution may be to use delay cells or delay lines, which are able to shift the reference phase for each clocking PLL in the system that generates the individual sampling clock for the ADC on each module. However, this again requires a lot of design effort, as well as requiring area and power. Additionally, a delay line may degrade the phase noise of the complete system considerably.

Inter-module mismatch of the delay of the clock path from the reference clock via the PLL clock signal generator towards the ADC sampling stage is another source of clock skew limiting the radar system resolution even for a perfectly matching reference clock distribution.

A further possible solution to align the ADC sampling is to adjust the ADC sampling clock in each module. A delay line could also be used for this purpose. This provides similar restrictions as for a delay line in the reference path with respect to phase noise and area. This solution also needs considerably more power due to the higher frequency.

Figure 2:
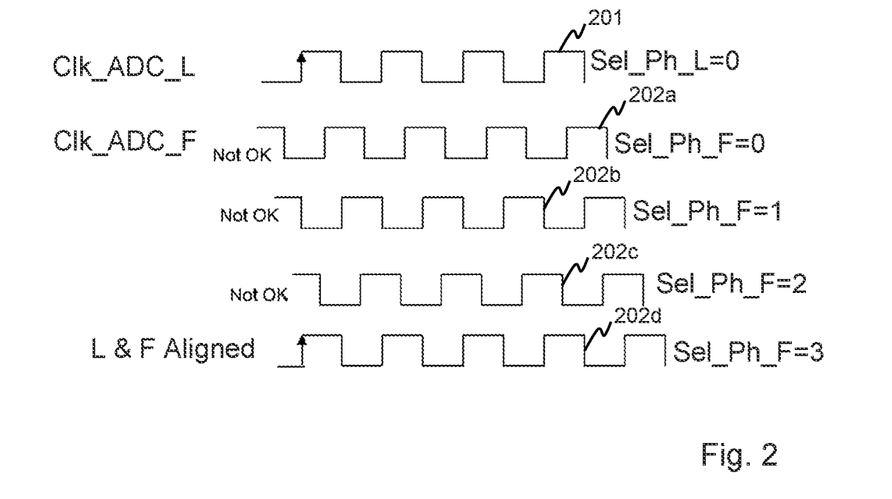
FIG. 2 is a schematic diagram illustrating a leader clock signal and multiple phase shifted clock signals.

FIG. 2 illustrates a series of clock signals, with a first clock signal 201 Clk_ADC_L produced by a PLL clock signal generator on the leader transceiver 101a. Each of the follower transceivers 101b-d generate a version of the clock signal 201 Clk_ADC_F via their own PLL clock signal generators, which will tend to vary in phase relative to the first clock signal. A version of the clock signal Clk_ADC_F at each follower transceiver 101b-d therefore needs to be adjusted to align its phase with the leader clock signal 201. This may be done by applying a phase adjustment at each follower transceiver, as shown in FIG. 2 by Sel_Ph_F=0,1,2 and 3. The phase shifted signal 202d applying the phase shift Sel_Ph_F=3 most closely matches the leader clock signal 201, so is used for that particular follower module.

All of the above approaches do not take into consideration variation over temperature, supply voltage and aging effects. The delay line approach also results in limitations on the phase noise performance of the reference clock and hence for the complete system.

SUMMARY

According to a first aspect there is provided a radar system comprising a plurality of radar transceiver modules mounted to a common PCB, the plurality of radar transceiver modules comprising a leader module and one or more follower modules, the leader module comprising a first oscillator configured to provide a first clock signal at a first frequency to each follower module, each of the leader and follower modules comprising a phase locked loop, PLL, clock signal generator comprising:
 a phase comparator connected to receive the first clock signal and a feedback signal;
 a loop filter connected to receive an output signal from the phase comparator;
 a second oscillator connected to receive an output signal from the loop filter and generate a second clock signal at a second frequency;
 a divide by n clock divider connected to receive the second clock signal from the second oscillator and to output 2n phase shifted clock signals at a third frequency;
 a feedback device connected to receive one of the phase shifted clock signals from the divide by n clock divider and provide the feedback signal to the phase comparator; and
 a multiplexer connected to receive the 2n phase shifted clock signals from the divide by n clock divider and output a third clock signal selected by an input phase select signal.

The radar system disclosed herein simplifies implementation of leader-follower multi-chip radar sensors mounted on a common PCB and allows for compromises on the phase alignment of the reference clock distribution because this can be compensated for. The radar system enables phase coherent sampling clocks to be generated for ADCs located in different modules by the use of selectable clock phases output from a feedback differential multiphase divider in a PLL. The phases generated may for example have a duty cycle of 50% out of a divide-by-3 divider. The ability to generate multiple phases is self-contained and does not require a control circuit, only a phase select signal to obtain a required phase.

The output of the multiplexer may be connected to an analog to digital converter, ADC, arranged to receive signals from a radar signal receiver.

The number n may be an odd integer of 3 or more. Example values for n may be 3, 5, 7 or higher. In alternative arrangements n may be an even number, for example an even integer of 2, 4, 6 or more.

The divide-by-n clock divider may comprise a divider core configured to divide the second clock signal into an intermediate clock signal, a chain of flip-flops configured to receive alternating edges of the intermediate clock signal and a plurality of logic gates arranged to combine outputs from consecutive pairs of the chain of flip-flops to provide the output phase shifted clock signals at the third frequency.

In some examples, the divide by n clock divider may comprise five flip-flops, FFs, arranged to receive the second clock signal from the second oscillator, three OR gates and one AND gate arranged to receive outputs from the FFs. The divide by n clock divider may comprise three inverters connected to a respective OR gate output, 3 of the phase shifted clock signals being output by the OR gates and another 3 of the phase shifted clock signals being output by the inverters.

In alternative examples, the divide by n clock divider may comprise eight FFs arranged to receive the second clock signal from the second oscillator and six OR gates arranged to receive outputs from the FFs and provide the 2n phase shifted clock signals.

In alternative examples, the divide by n clock divider may comprises five FFs arranged to receive the second clock signal from the second oscillator, three OR gates arranged to receive outputs from the FFs and provide n of the 2n phase shifted clock signals and three AND gates arranged to receive outputs from the FFs and provide another n of the 2n phase shifted clock signals.

In each of the above examples, NOR gates may be used in place of OR gates and NAND gates may be used in place of AND gates.

The first frequency may for example be in a range between around 1 and 100 MHz.

The third frequency may for example be in a range between around 1 and 10 GHz.

The radar system may comprise a non-volatile memory configured to store a value of the input phase select signal, the radar system being configured to retrieve a stored value of the input phase select signal for each module during operation of the radar system.

The feedback device may for example be a divide-by-m clock divider, a time-to- digital converter or a combination of both.

According to a second aspect there is provided a method of calibrating a radar system according to the first aspect, the method comprising:
  operating each of the plurality of radar transceiver modules to detect a target;
  determine a phase select signal for the divide by n clock divider of the PLL clock signal generator in each module to minimize a difference in phase between the third clock signal in each follower module and in the leader module; and
  storing the determined phase select signal for each of the plurality of radar transceiver modules in a non-volatile memory.

The calibration method may be carried out once during manufacture of the radar system, for example after mounting the radar transceiver modules on the common PCB. In case of any variation after manufacture, the calibration method may be carried out periodically after manufacture, for example at yearly service intervals.

According to a third aspect there is provided a method of operating a radar system according to the first aspect, the method comprising:
  retrieving a phase select signal for each of the plurality of radar transceiver modules from a non-volatile memory; and
  operating each of the plurality of radar transceiver modules while providing the retrieved phase select signal to the divide by n clock divider of the PLL clock signal generator in each module.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

If the reference phase between the radar transceiver modules 101a-d is fixed and stable on the PCB 102 and does not vary after mounting the modules on the PCB, for example due to aging, the sampling clock in each follower module can be phase aligned with respect to the sampling clock of the leader module.

The aim of the present disclosure is to generate ADC sampling clocks for a radar system comprising one or more follower transceiver modules that can be phase-aligned to a reference clock signal from a leader module, preferably with a resolution of less than 100 ps and with a duty cycle of 50% derived from a divide-by-3 clock divider.

Figure 3:
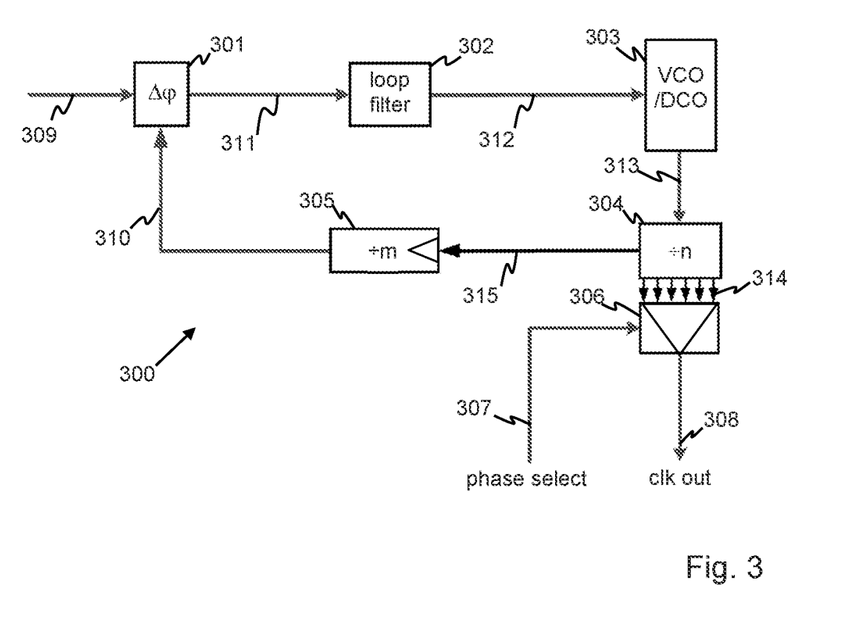
FIG. 3 is a schematic diagram of an example PLL clock signal generator.

An example implementation of a PLL 300 for generating a clock signal with a selectable phase is illustrated in FIG. 3. The PLL 300 comprises a divide-by-3 clock divider 304 as part of the feedback loop of the PLL 300, which ensures a constant phase relation between the reference clock of the PLL and not only the output clock of the divider 304 but with all signal phases output by the divider 304. A differential clock divider system with a clk_p and a clk_n input signal may be obtained from the oscillator 303 which have an accurate 180° phase relation, which is typically available from differential circuits and signal processing. This can be achieved by design measures. A multiplexer 306 with a phase select control signal 307 determines the phase of the output clock signal 308.

The PLL clock signal generator 300 comprises a phase comparator 301, a loop filter 302, an oscillator 303, which may be a voltage controlled oscillator (VCO) or digitally controlled oscillator (DCO), a divide-by-n clock divider 304, a feedback device 305 and a multiplexer 306. The feedback device 305 may for example be a divide-by-m clock divider, a time-to-digital converter or a combination of both. The phase comparator 301 receives a first clock signal 309 from an oscillator at the leader module, which in this example is a reference clock signal at a reference frequency $f_{ref}$, and a feedback signal 310 at the same frequency from the feedback device 305. An output signal 311 of the phase comparator 301 is provided to the loop filter 302, which provides a control signal 312 to the oscillator 303. The oscillator 303 generates a second clock signal 313 that is provided to the divide-by-n clock divider 304. In a typical example n may be 3, such that the divider 304 outputs a series of clock signals 314 at different phases, each having a frequency of ⅓ that of the second clock signal. One of the clock signals 315 is provided to the feedback device, which divides the clock signal 315 to result in a feedback signal 310 at the same frequency $f_{ref}$ as the input first clock signal 309.

The multiple clock signals 314 are input to a multiplexer 306, which selects one of the clock signals 314 according to a phase select signal 307, providing a third clock signal 308 that is provided to an ADC of the transceiver module.

The PLL clock signal generator 300 may be operated by determining the correct phase for each module during product testing of each transceiver module once mounted on the common PCB and then storing the correct setting in a memory. The required phase will be dominantly determined by the layout of the modules on the PCB and can therefore be assumed to be constant.

Figure 4:
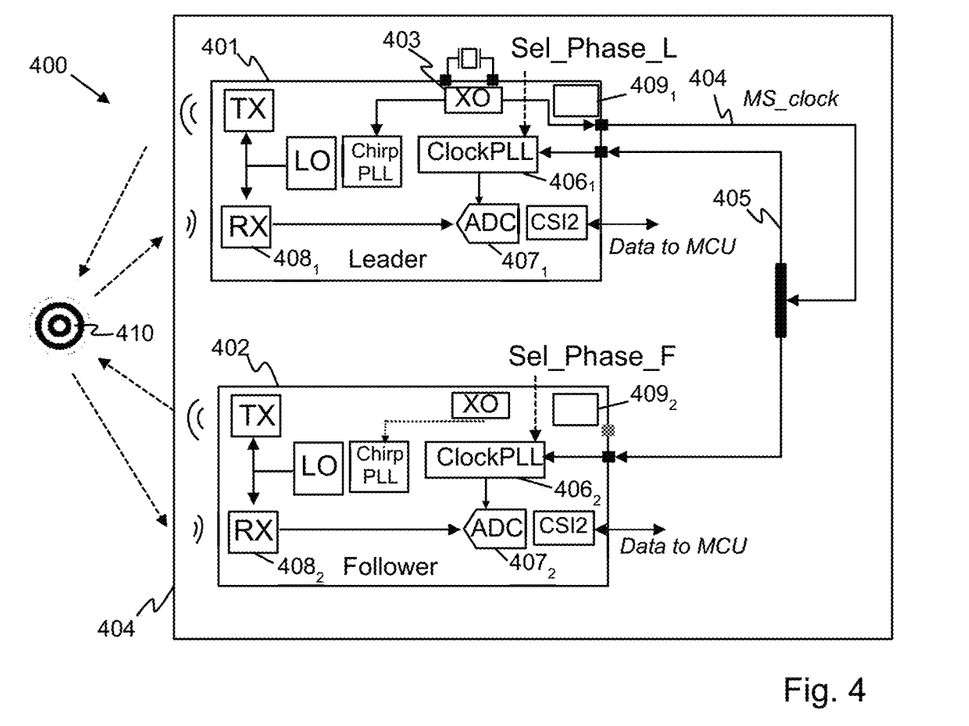
FIG. 4 is an example radar system having a leader transceiver module and one follower transceiver module.

FIG. 4 is a schematic diagram of an example radar system 400 comprising a plurality of radar transceiver modules 401, 402 mounted on a common PCB 404, a first module 401 being a leader module and a second module 402 being a follower module. The leader module 401 comprises a first oscillator 403, which provides a first clock signal at a first frequency. The first clock signal is provided via connection paths 404, 405 between the modules 401, 402 to each of the modules 401, 402. The connection paths 404, 405 are configured to provide the first clock signal as an input to a PLL clock signal generator $406_1$, $406_2$ in each module. The clock signal generator $406_1$, $406_2$ in each module 401, 402 is of the form described above in relation to FIG. 3, with the phase select signal 307 being indicated by the signals Sel_Phase_L (for the leader module 401) and Sel_Phase_F (for the follower module 402). The clock signal generator $406_1$, $406_2$ in each module provides an output clock signal at the appropriate phase to an analog to digital converter $407_1$, $407_2$, which receives signals from a radar receiver $408_1$, $408_2$ in each module 401, 402. Matching the phases of the clock signals provided to each ADC allows the radar system 400 to combine the signals from each module 401, 402 to obtain a finer resolution. Other components of the radar transceiver modules 401, 402 such as the local oscillator (LO), transmitter (TX), chirp signal generator (Chirp PLL) and signal processor (CSI2) that are required to ensure a high resolution radar system will be known to the skilled person and are therefore not described in detail here.

In a test and calibration procedure during manufacture and assembly, once the modules 401, 402 are mounted on the PCB 404 the modules 401, 402 are operated to detect a known target 410. Signals received from the target by the receivers $408_1$, $408_2$ in each module can be used to select the appropriate phase signal provided to the ADC in each follower module 402. Although only one follower module 402 is shown in FIG. 4, it will be appreciated that more than one follower module may be provided, with each additional follower module being essentially identical to the follower module 402 shown and receiving the same first clock signal from the leader module 401. Once the appropriate phase is selected for each module, the phase select signal 307 is saved in non-volatile memory on the radar system 400 to be used when the radar system 400 is subsequently operated. Each module 401, 402 may for example comprise a non-volatile memory $409_1$, $409_2$ for storing a phase select value to be used when operating the radar system 400. In alternative arrangements a single non-volatile memory may be provided common to each of the radar modules 401, 402 and may be provided on one of the modules or separately from the modules.

Figure 5:
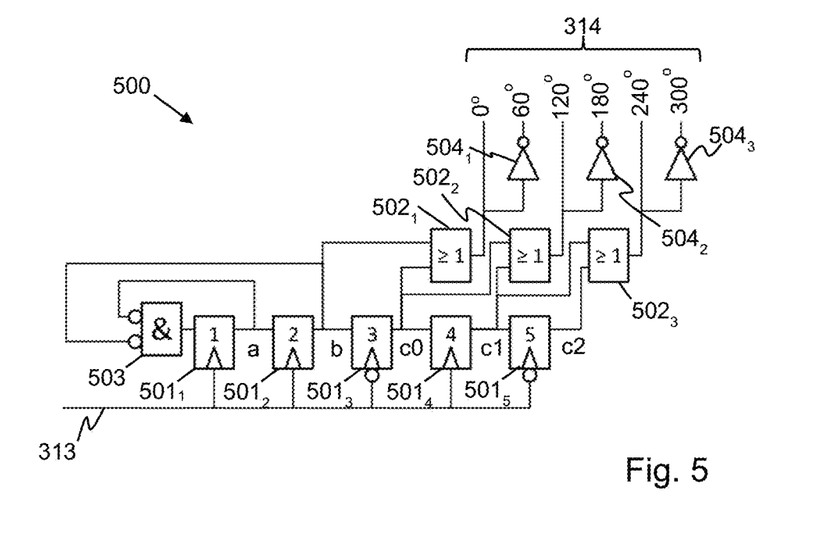
FIGS. 5, 6 and 7 are schematic diagrams of example logic circuits for providing a divide-by-3 clock signal divider with multiple phase outputs.
Figure 6:
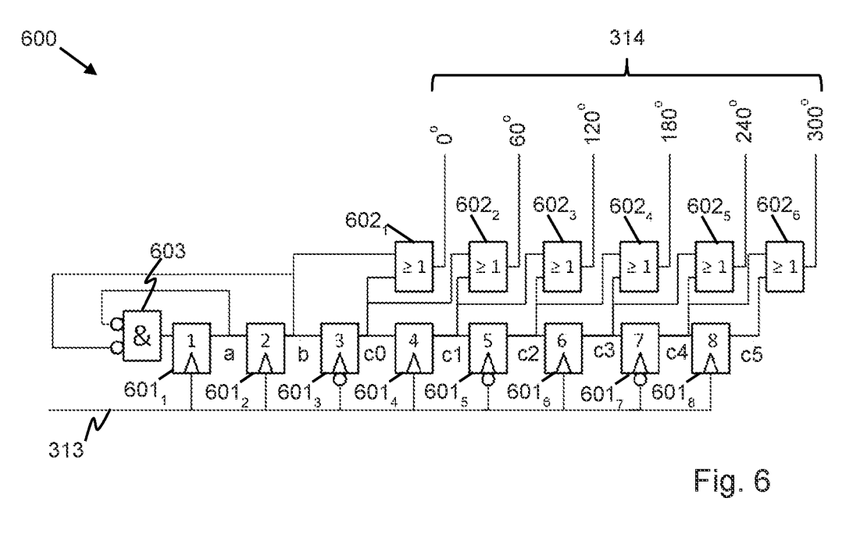
Figure 7:
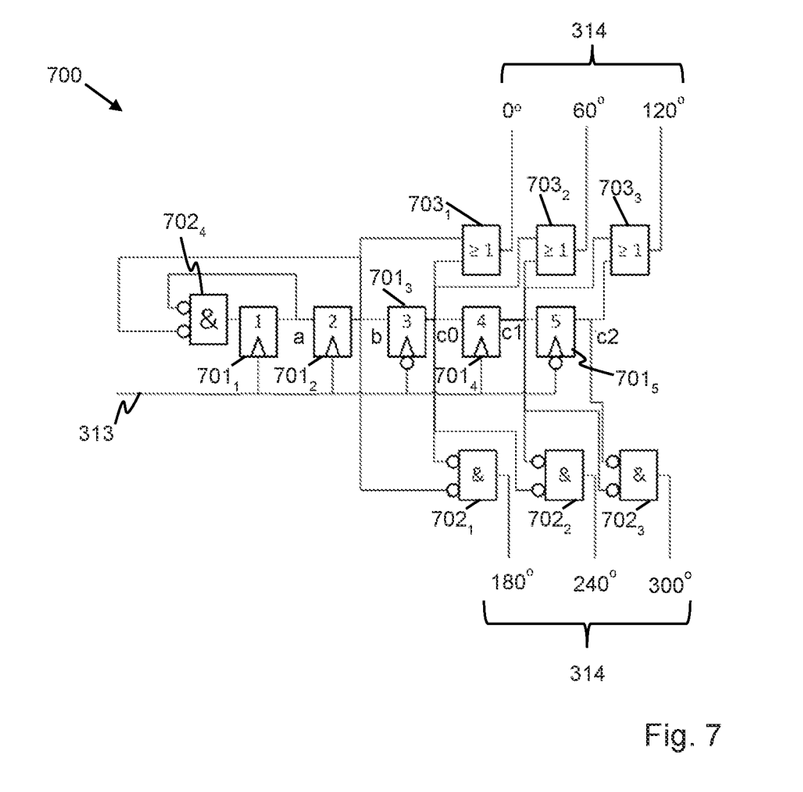

FIGS. 5, 6 and 7 illustrate three different example divider structures for a divide-by-3 clock divider providing a 50% duty cycle output clock signal, each of which receives the second clock signal 313 from the VCO/DCO 303 and outputs the 2n phase shifted clock signals 314. Each of these examples have in common a differential clock input provided by the VCO/DCO 303 and a divide-by-3 arrangement using multiple flip-flops (FFs) providing output signals with a duty cycle of 33% (i.e. ⅓) or 66% (⅔), which is then used to generate multiple output clock signals with a duty cycle of 50%. A differential input clock signal allows the FFs to operate at rising or falling clock edges by just swapping the clock inputs. To achieve a 50% output duty cycle at the divider requires: i) a clock signal from the VCO or DCO with a 50% duty cycle; ii) a divider core providing the clock division (i.e. the first two FFs in the examples shown); iii) a chain of FFs which operate at alternating edges; and iv) logic gates (AND/NAND, OR/NOR) which combine the output signals of two consecutive FFs in the chain of alternatingly clocked FFs. In a general aspect therefore, the second clock signal has a 50% duty cycle and the divide-by-n clock divider comprises a divider core configured to divide the second clock signal into an intermediate clock signal, a chain of flip-flops configured to receive alternating edges of the intermediate clock signal and a plurality of logic gates arranged to combine outputs from consecutive pairs of the chain of flip-flops to provide the output phase shifted clock signals at the third frequency. The intermediate clock signal will have either a ⅓ or ⅔ duty cycle if n is an odd integer, while the output phase shifted clock signals will have a 50% duty cycle. The divider core may be a pair of flip-flops.

Figure 8:
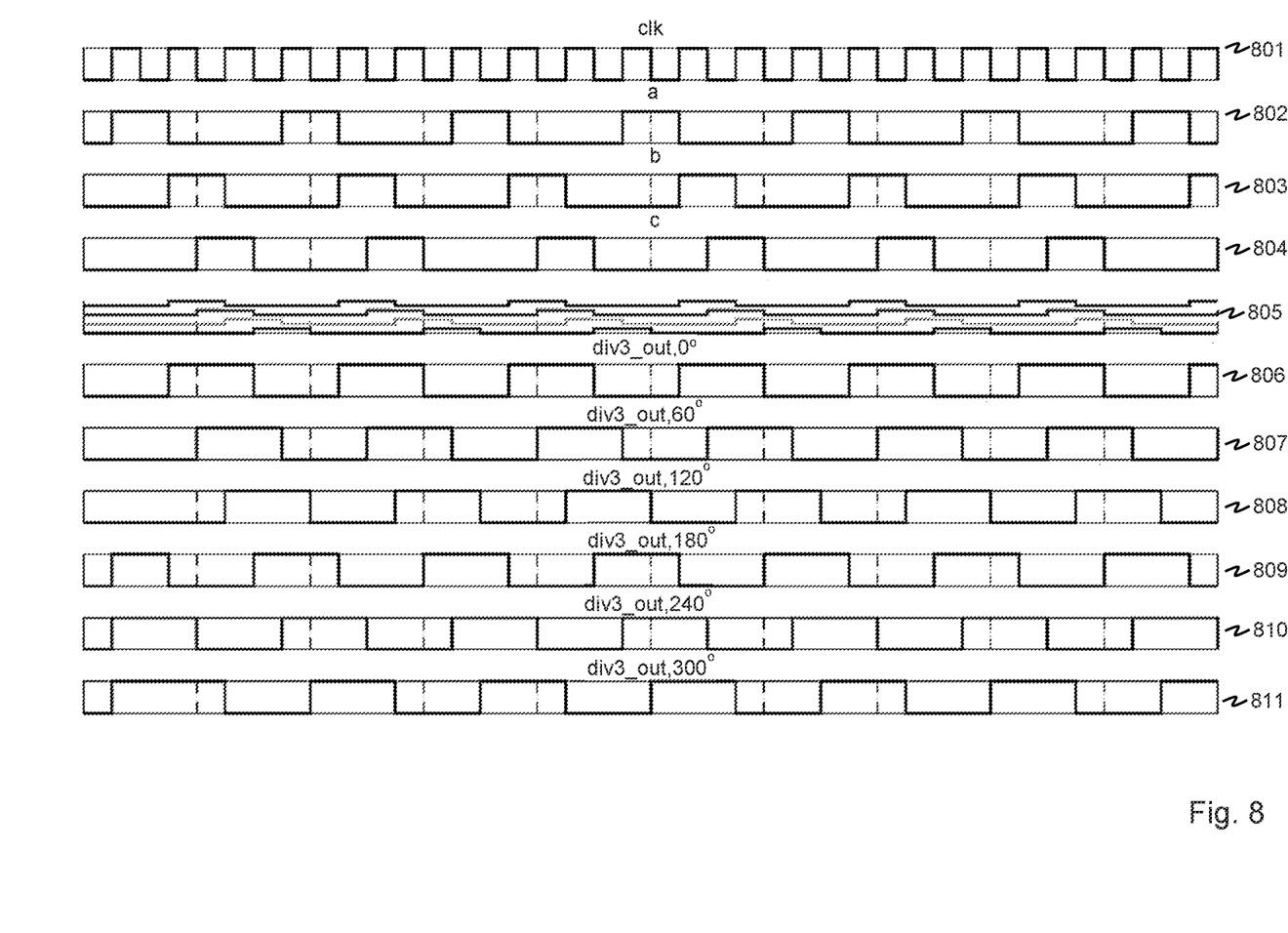
FIG. 8 is a plot of a series of clock signals in an example divide-by-3 clock signal divider.

The divider output is delayed by half an input clock cycle a number of times. The output with a 50% duty cycle is generated by combining two delayed signals such that the result provides a 50% duty cycle at the divided frequency. FIG. 8 illustrates a series of clock signals with the input clock signal 801, three intermediate clock signals 802, 803, 804 with a 33% duty cycle and differing phases, various delayed versions 805 of the intermediate clock signals and the 50% duty cycle output signals 806, 807, 808, 809, 810, 811 at successive phases ranging from 0° to 300° at 60° intervals, resulting from combinations of the intermediate and delayed signals 802-805.

In the example divider 500 in FIG. 5, a combination of five flip flops (FFs) $501_{1-5}$, three OR gates $502_{1-3}$, an AND gate 503 and three inverters $504_{1-3}$ is used to generate six output clock signals 314 having a uniformly distributed range of phases in 60° increments. The divider core of the divider 500 consists of the first two FFs $501_{1,2}$ and the chain of FFs consists of FFs $501_{3-5}$. Opposing phases (0° and 180°, 60° and 240°, 120° and) 300° are created by inversion using inverters $504_{1-3}$. If the divider structure 500 is completely differential, the inversion can be achieved instead simply by wiring and without any additional gates. This way also accurate phase alignment is achieved. The load for all of the FFs $501_{1-5}$ may be identical, which may for example be achieved by loading the final FF $501_5$ with a further FF or an equivalent dummy load.

FIG. 6 shows an alternative clock divider structure 600 with 8 FFs $601_{1-8}$, one AND gate 603 and 6 OR gates $602_{1-6}$. The divider core of the divider 600 consists of the first two FFs $601_{1,2}$ and the chain of FFs consists of FFs $601_{3-8}$. This structure can be implemented in either single ended or differential versions. In both cases, the expected duty cycle is 50%. As with the divider 500 in FIG. 5, 60° phase alignment can be achieved from the output clock signals 314. However, the number of components in terms of gates and FFs is larger than in the example in FIG. 5. The final FF $601_8$ may be loaded by a dummy device to balance the load of the FFs and therefore the propagation delay of the clock phases.

FIG. 7 illustrates a further alternative clock divider structure 700 that needs 5 FFs $701_{1-5}$, 4 AND-gates $702_{1-3}$ and 3 OR-gates $703_{1-3}$. The OR gates $703_{1-3}$ output the 0°, 60° and 120° phases, while three of the AND gates $702_{1-3}$ output inverted versions of these phases, i.e. the 180°, 240° and 300° phases. The divider core of the divider 700 consists of the first two FFs $701_{1,2}$ and the chain of FFs consists of FFs $701_{3-5}$. In this case, care needs to be taken to ensure an equal load on each branch and to minimise any different delays of the AND and OR-gates to achieve proper phase- and duty-cycle alignment. If delays of AND- and OR-gates can be balanced, the circuit is advantageous compared to the implementation in FIG. 5 because it does not use inverters for creating the inverted signals, thereby getting rid of the additional inverter delay that may reduce phase accuracy at high operating frequencies.

In each of the clock divider designs described above and shown in FIGS. 5, 6 and 7, careful design and layout is essential to ensure that every FF and every gate gets the same load, which may include the usage of dummy load stages not shown in FIGS. 5, 6 and 7. Further care needs to be taken to minimize the phase noise contribution of the divider.

It will be appreciated that each of the clock divider structures 500, 600, 700 are only examples where n=3 and each may be extended further to higher values for n (where n is an odd integer) by adding further FFs and gates to achieve a higher number of phases in the output signals 314. The concept of overlaying differential phases with a duty cycle that differs from 50% can be extended to any odd divider ratio such as a divide-by-5 or divide-by-7 divider to achieve a duty cycle of 50% and to allow phase selection with a resolution up to 360°/2n, where n is the divider ratio, i.e. a resolution of 60° for a divide by three divider, a resolution of 36° for a divide by 5 divider, a resolution of around 25.7° for a divide by 7 divider and so on.

Using such a divider enables a solution to the problem of generating a 50% duty cycle clock signal with an odd division ratio and including a phase shifter for multi-module phase alignment without additional costly circuits such as delay lines.

The clock signal dividers disclosed herein can be used to generate phase coherent sampling clocks for ADCs located in different modules by selecting a clock phase of a feedback differential multiphase divider in a PLL. The phases generated can have an accurate duty cycle of 50% from a divide-by-n divider where n is an odd integer of 3 or more.

Figure 9:
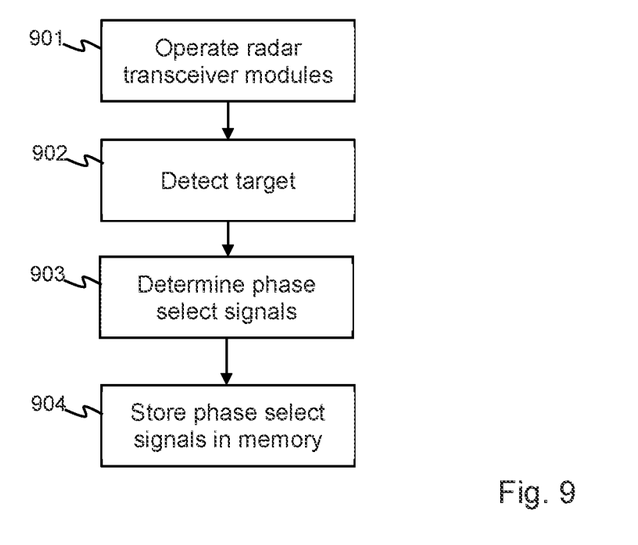
FIG. 9 is a schematic flow diagram of an example method of calibrating a radar system of the type disclosed herein.

FIG. 9 is a schematic diagram illustrating a method of calibrating a radar system of the type disclosed herein. In a first step 901, each of the plurality of radar transceiver modules is operated, and in a second step 902 a known target is detected. In step 903, a phase select signal is determined that minimises a difference in phase between the third clock signal in each follower module and in the leader module. In step 904, the phase select signal is stored in memory for each of the radar transceiver modules.

Figure 10:
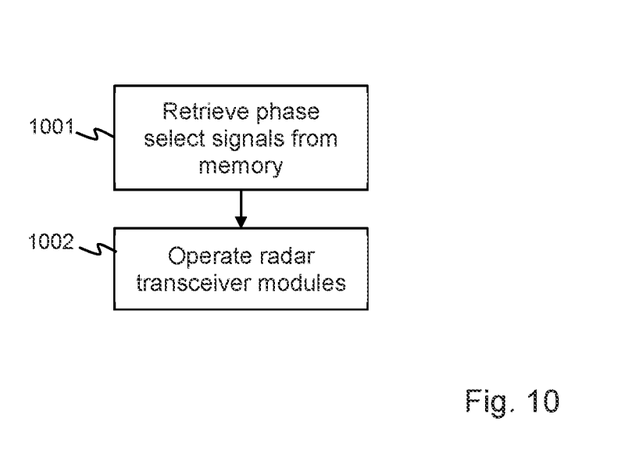
FIG. 10 is a schematic flow diagram of an example method of operating a radar system of the type disclosed herein.

FIG. 10 is a schematic diagram illustrating a method of operating a radar system of the type disclosed herein. In a first step 1001, a phase select signal is retrieved from memory for each of the radar transceiver modules. In a second step 1002, the radar transceiver modules are operated using the retrieved phase select signals for the divide by n clock signal divider of each module.

From reading the present disclosure, other variations and modifications will be apparent to the skilled person. Such variations and modifications may involve equivalent and other features which are already known in the art of radar systems, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

What is claimed is:

1. A radar system comprising a plurality of radar transceiver modules mounted to a common PCB, the plurality of radar transceiver modules comprising a leader module and one or more follower modules, the leader module comprising a first oscillator configured to provide a first clock signal at a first frequency to each follower module, each of the leader and follower modules comprising a phase locked loop, PLL, clock signal generator comprising:

a phase comparator connected to receive the first clock signal and a feedback signal;

a loop filter connected to receive an output signal from the phase comparator;

a second oscillator connected to receive an output signal from the loop filter and generate a second clock signal at a second frequency;

a divide by n clock divider connected to receive the second clock signal from the second oscillator and to output 2n phase shifted clock signals at a third frequency;

a feedback device connected to receive one of the phase shifted clock signals from the divide by n clock divider and provide the feedback signal to the phase comparator; and a multiplexer connected to receive the 2n phase shifted clock signals from the divide by n clock divider and output a third clock signal selected by an input phase select signal;

wherein the divide-by-n clock divider in each of the plurality of radar transceiver modules comprises a divider core configured to divide the second clock signal into an intermediate clock signal, a chain of flip-flops configured to receive alternating edges of the intermediate clock signal and a plurality of logic gates arranged to combine outputs from consecutive pairs of the chain of flip-flops to provide the output phase shifted clock signals at the third frequency, and wherein the divide by n clock divider comprises five flip-flops, FFs, arranged to receive the second clock signal from the second oscillator, three OR gates and one AND gate arranged to receive outputs from the FFs.

2. The radar system of claim 1, wherein the output of the multiplexer in each of the plurality of radar transceiver modules is connected to an analog to digital converter, ADC, arranged to receive signals from a radar signal receiver.

3. The radar system of claim 1, wherein n is an odd integer of 3 or more.

4. The radar system of claim 3, wherein n=3, 5 or 7.

5. The radar system of claim 1 wherein the divide by n clock divider comprises three inverters connected to a respective OR gate output, 3 of the phase shifted clock signals being output by the OR gates and another 3 of the phase shifted clock signals being output by the inverters.

6. The radar system of claim 1, wherein the divide by n clock divider comprises eight FFs arranged to receive the second clock signal from the second oscillator and six OR gates arranged to receive outputs from the FFs and provide the 2n phase shifted clock signals.

7. The radar system of claim 1, wherein the divide by n clock divider comprises five FFs arranged to receive the second clock signal from the second oscillator, three OR gates arranged to receive outputs from the FFs and provide n of the 2n phase shifted clock signals and three AND gates arranged to receive outputs from the FFs and provide another n of the 2n phase shifted clock signals.

8. The radar system of claim 1, wherein the first frequency is in a range of between around 1 and 100 MHz.

9. The radar system of claim 1, wherein the third frequency is in a range between around 1 and 10 GHz.

10. The radar system of claim 1, comprising a non-volatile memory configured to store a value of the input phase select signal, the radar system being configured to retrieve a stored value of the input phase select signal for each module during operation of the radar system.

11. The radar system of claim 1, wherein the feedback device in each of the plurality of radar transceiver modules is a divide-by-m clock divider and/or a time-to-digital converter.

12. A method of calibrating a radar system according to claim 1, the method comprising:

operating each of the plurality of radar transceiver modules to detect a target;

determine a phase select signal for the divide by n clock divider of the PLL clock signal generator in each module to minimize a difference in phase between the third clock signal in each follower module and in the leader module; and storing the determined phase select signal for each of the plurality of radar transceiver modules in a non-volatile memory.

13. A method of operating a radar system according to claim 1, the method comprising:

retrieving a phase select signal for each of the plurality of radar transceiver modules from a non-volatile memory; and operating each of the plurality of radar transceiver modules while providing the retrieved phase select signal to the divide by n clock divider of the PLL clock signal generator in each module.

14. The method of claim 13, wherein the divide-by-n clock divider in each of the plurality of radar transceiver modules comprises a divider core configured to divide the second clock signal into an intermediate clock signal, a chain of flip-flops configured to receive alternating edges of the intermediate clock signal and a plurality of logic gates arranged to combine outputs from consecutive pairs of the chain of flip-flops to provide the output phase shifted clock signals at the third frequency.

15. The method of claim 13, wherein the output of the multiplexer in each of the plurality of radar transceiver modules is connected to an analog to digital converter, ADC, arranged to receive signals from a radar signal receiver.

16. The method of claim 13, wherein the radar system comprises a non-volatile memory configured to store a value of the input phase select signal, the radar system being configured to retrieve a stored value of the input phase select signal for each module during operation of the radar system.

17. The method of claim 13, wherein the feedback device in each of the plurality of radar transceiver modules is a divide-by-m clock divider and/or a time-to-digital converter.

18. The method of claim 13, wherein the first frequency is in a range of between around 1 and 100 MHz.

19. A radar system comprising a plurality of radar transceiver modules mounted to a common PCB, the plurality of radar transceiver modules comprising a leader module and one or more follower modules, the leader module comprising a first oscillator configured to provide a first clock signal at a first frequency to each follower module, each of the leader and follower modules comprising a phase locked loop, PLL, clock signal generator comprising:

a phase comparator connected to receive the first clock signal and a feedback signal;

a loop filter connected to receive an output signal from the phase comparator;

a second oscillator connected to receive an output signal from the loop filter and generate a second clock signal at a second frequency;

a divide by n clock divider connected to receive the second clock signal from the second oscillator and to output 2n phase shifted clock signals at a third frequency;

a feedback device connected to receive one of the phase shifted clock signals from the divide by n clock divider and provide the feedback signal to the phase comparator; and a multiplexer connected to receive the 2n phase shifted clock signals from the divide by n clock divider and output a third clock signal selected by an input phase select signal;

wherein the divide-by-n clock divider in each of the plurality of radar transceiver modules comprises a divider core configured to divide the second clock signal into an intermediate clock signal, a chain of flip-flops configured to receive alternating edges of the intermediate clock signal and a plurality of logic gates arranged to combine outputs from consecutive pairs of the chain of flip-flops to provide the output phase shifted clock signals at the third frequency, and wherein the divide by n clock divider comprises eight FFs arranged to receive the second clock signal from the second oscillator and six OR gates arranged to receive outputs from the FFs and provide the 2n phase shifted clock signals.

20. A radar system comprising a plurality of radar transceiver modules mounted to a common PCB, the plurality of radar transceiver modules comprising a leader module and one or more follower modules, the leader module comprising a first oscillator configured to provide a first clock signal at a first frequency to each follower module, each of the leader and follower modules comprising a phase locked loop, PLL, clock signal generator comprising:

a phase comparator connected to receive the first clock signal and a feedback signal;

a loop filter connected to receive an output signal from the phase comparator;

a second oscillator connected to receive an output signal from the loop filter and generate a second clock signal at a second frequency;

a divide by n clock divider connected to receive the second clock signal from the second oscillator and to output 2n phase shifted clock signals at a third frequency;

a feedback device connected to receive one of the phase shifted clock signals from the divide by n clock divider and provide the feedback signal to the phase comparator; and a multiplexer connected to receive the 2n phase shifted clock signals from the divide by n clock divider and output a third clock signal selected by an input phase select signal;

wherein the divide-by-n clock divider in each of the plurality of radar transceiver modules comprises a divider core configured to divide the second clock signal into an intermediate clock signal, a chain of flip-flops configured to receive alternating edges of the intermediate clock signal and a plurality of logic gates arranged to combine outputs from consecutive pairs of the chain of flip-flops to provide the output phase shifted clock signals at the third frequency, and wherein the divide by n clock divider comprises five FFs arranged to receive the second clock signal from the second oscillator, three OR gates arranged to receive outputs from the FFs and provide n of the 2n phase shifted clock signals and three AND gates arranged to receive outputs from the FFs and provide another n of the 2n phase shifted clock signals.

* * * * *